United States Patent
Baudelot et al.

(10) Patent No.: US 6,434,019 B2
(45) Date of Patent: Aug. 13, 2002

(54) METHOD FOR REDUCING LOSSES DURING THE COMMUTATION PROCESS

(75) Inventors: Eric Baudelot, Weisendorf; Manfred Bruckmann, Nürnberg; Heinz Mitlehner, Uttenreuth; Benno Weis, Hemhofen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/873,506

(22) Filed: Jun. 4, 2001

Related U.S. Application Data

(63) Continuation of application No. PCT/DE99/03707, filed on Nov. 22, 1999.

(30) Foreign Application Priority Data

Dec. 3, 1998 (DE) .......................... 198 55 900

(51) Int. Cl.$^7$ .............................................. H02M 3/335
(52) U.S. Cl. ...................................... 363/16; 363/56.05
(58) Field of Search .............................. 363/56.05, 40, 363/131, 132, 16

(56) References Cited

U.S. PATENT DOCUMENTS 4,792,885 A * 12/1988 Cuman et al. ............... 363/16
5,973,943 A * 10/1999 Ribarich et al. ............ 323/235

FOREIGN PATENT DOCUMENTS

| DE | 4007564 | 3/1990 |
| DE | 19610135 | 3/1996 |
| FR | 2693325 | 7/1992 |

OTHER PUBLICATIONS

Use of the Mosfet Channel Reverse Conduction in an Inverter for Suppression of the Integral Diode Recovery Current, Huselstein, J.-J, Gauthier, C., and Glaize, C., (1993) EPE, 431–436. no month.

Commutation Behaviour in DC/AC–Converters with Power Mosfets, Lorenz, L., Jun., 1986 Proceedings, 316–330.

A Matrix Converter Switching Controller for Low Losses Operation Without Snubber Circuits, Cittadini,, R., Huselstein, J.-J, and Glaize, C., Sep. 8–10, 1997, vol. 4, 199–203.

* cited by examiner

Primary Examiner—Shawn Riley
(74) Attorney, Agent, or Firm—BakerBotts LLP

(57) ABSTRACT

The invention provides a method by which losses are reduced during the commutation of a free-running, driven power converter valve (T2) of an invertor phase (2) to a current-accepting power converter valve (T1) of said invertor phase (2). The current-accepting power converter valve (T1) is switched on at the beginning of the commutation process and the free-running, driven power converter valve (T2) is rapidly switched off as soon as the value of its drain voltage ($U_D$) is zero.

2 Claims, 4 Drawing Sheets

METHOD FOR REDUCING LOSSES DURING THE COMMUTATION PROCESS

This is a continuation of International Application No. PCT/DE99/03707 filed Nov. 22, 1999.

FIELD OF THE INVENTION

The invention relates to a method for reducing losses during the commutation of a free-running, driven power converter valve of an invertor phase to a current-accepting power converter valve of said invertor phase.

BACKGROUND OF THE INVENTION

The publication entitled "Use of the MOSFET Channel Reverse Conduction in an Invertor for Suppression of the Integral Diode Recovery Current", printed in the Conference Report "The European Power Electronics Association", 13. to 16.09.1993, in Brighton, pages 431 to 436 ("EPE"), discloses a method by which losses are reduced during the commutation process. This known method is used in a polyphase invertor having Metal-Oxide Semiconductor Field-Effect Transistors (MOSFETs) as power converter valve.

MOSFETs are unipolar power semiconductors which are able to carry current in both directions. Every MOSFET has a parasitic bipolar freewheeling diode reverse-connected in parallel, said diode generally being designated as an inverse diode. This freewheeling diode has properties which are not optimal for the operation of the power converter valve, since it cannot be produced as a separate chip in a separate process. It is an integral part of the MOSFET. This inverse diode has a non-optimal on-state behavior and non-optimized stored charge.

FIG. 1 illustrates a known circuit of an invertor phase 2, which has a MOSFET in each case as power converter valves T1 and T2. The antiparallel bipolar freewheeling diode of the power converter valve T1 and T2 is designated by RD1 and RD2, respectively. On the DC voltage side, this invertor phase 2 is linked to a DC voltage source 4 across which a DC voltage $U_{ZK}$ is dropped, and which is also designated as intermediate circuit voltage. The junction point 6 between the two power converter valves T1 and T2 that are electrically connected in series forms an AC connection to which a load can be connected. The MOSFETs used are normally off MOSFETs, which are designated as enhancement-mode MOSFETs. In n-channel enhancement-mode MOSFETs, a drain current flows only when the gate-source voltage UGS exceeds a predetermined positive value.

FIG. 2 illustrates a current/voltage characteristic of a MOSFET which is disclosed in the "EPE" conference report. This current/voltage characteristic has different characteristic curves running in the quadrants I and III. That part of the characteristic curve in the quadrant I which is designated by $T_c$ is used when the MOSFET is driven by means of a gate-source voltage $U_{GS}$=15 V. That part of the characteristic curve in the quadrant III which is designated by $T_{RCC}$ is used when the MOSFET is driven and a load current $I_{LOAD}$ flows counter to the main direction through the MOSFET. If the MOSFET is not driven ($U_{GS}$=0 V), then the characteristic curve in the quadrant III which is designated by $T_D$ is used. In other words, the integral freewheeling diode RD of the MOSFET carries the load current $I_{LOAD}$.

In accordance with this characteristic, it can be seen that the on-state losses of a MOSFET can be reduced if the MOSFET is driven in free-running operation. As a result, the free-running current is divided between the transistor and the integral free-wheeling diode RD. This operation is characterized by the characteristic curve $T_{RCCD}$ in the quadrant III.

During the commutation process from the power converter valve T2, which is free-running and is driven, to the current-accepting power converter valve T1 (FIG. 1), it is necessary, in accordance with the publication "Commutation Behaviour in DC/AC-Converters with Power MOSFET", printed in "PCI", June 1986, pages 316 to 330, for the power converter valve T2 to be switched off before the power converter valve T1 is allowed to be switched on. This is necessary in order to prevent a short circuit as a result of the two power converter valves T1 and T2 being switched on simultaneously. This means that, at the instant of commutation, the integral freewheeling diode RD of the free-running power converter valve T2 carries the load current ILOAD and thus, on account of the stored charge, the freewheeling diode RD causes switch-off losses.

The "EPE" publication specifies a method whereby the load current $I_{LOAD}$ during the commutation process from the free-running, driven power converter valve T2 to the current-accepting power converter valve T1 is not carried by the integral freewheeling diode RD2 of the power converter valve T2. This known method is characterized in that the current-accepting power converter valve T1 is driven so slowly that only a minimal current overshoot occurs. The slow driving of the current-accepting power converter valve T1 results in an increase in the switch-on losses of said valve. The level of these switch-on losses is dependent on the switch-on delay. The current overshoot is comparable to a diode reverse current which additionally loads the power converter valve T1. For this temporally extended driving, overcurrent detection is required for each power converter valve T1 and T2 of an invertor phase 2. This current in the bridge path is detected by means of voltage measurement on a leakage inductance. To that end, on the one hand the value of the leakage inductance must be known exactly, and on the other hand a fast integrator must be provided, at the output of which the value of the current in the bridge path is then present. Connected downstream of this integrator is a peak value detector which, on the output side, is connected to an overcurrent control device. This method reduces the amplitude of the reverse recovery current and the switching losses of the free-running, driven power converter valve during the commutation process.

SUMMARY OF THE INVENTION

The present invention is based on the object of modifying the known method in such a way that the above mentioned disadvantages no longer occur. This object is achieved according to the present invention by virtue of the fact that the current-accepting power converter valve is switched on at the beginning of the commutation process, and that the free-running, driven power converter valve is rapidly switched off as soon as the value of its drain voltage is equal to zero.

The drain voltage of the free-running power converter valve is required as measured value for this method. This measured value is used during the known desaturation monitoring, which detects a short-circuit current or an overcurrent. In other words, a further measured-value detection device is not required in order to be able to carry out the method according to the invention.

As a result of the driving of the current-accepting power converter valve, the load current commutates from the free-running power converter valve to the current-accepting power converter valve. The value of the drain voltage of the free-running power converter valve changes as a function of this current commutation. At the beginning of commutation, the drain voltage has a negative value of the order of magnitude of the saturation voltage of the power converter valve. At the end of the load current commutation, the entire intermediate circuit voltage is dropped as reverse voltage across this power converter valve, since the current-accepting power converter valve carries the load current. From these two cut-off values of the drain voltage, it can be seen that the profile of the drain voltage has a zero crossing during the commutation process. It is exactly at this instant that the load current completely commutates to the current-accepting power converter valve. In order that the switch-off losses are minimized as far as possible, the free-running power converter valve must be switched off as rapidly as possible at this instant. Depending on how rapidly this switch-off is effected, a parallel-path current flows through the free-running power converter valve and through the current-accepting power converter valve in addition to the load current. In other words, the losses that occur cannot be eliminated, but rather can only be reduced depending on how rapidly the free-running power converter valve is switched off. This reduction of the losses is significantly greater than the reduction by means of the known method, since, in the case of the known methods, on the one hand there are processing steps for the measurement signal and on the other hand the overcurrent control device can operate only when an overcurrent has already occurred.

In a preferred embodiment of the method of the present invention, the gate voltage of the free-running, driven power converter valve is decreased, at the beginning of the commutation process until its drain voltage is equal to a predetermined reference voltage. This additional method step improves the identification of the voltage zero crossing of the drain voltage since, irrespective of the value of the saturation voltage of the free-running, driven power converter valve, the initial value of the drain voltage at the beginning of the commutation process always has the value of the reference voltage. This becomes apparent particularly in the case of small load currents.

BRIEF DESCRIPTION OF THE INVENTION

The present invention is further disclosed in connection with the drawings in which.

DETAILED DESCRIPTION OF THE INVENTION

Figure 1:
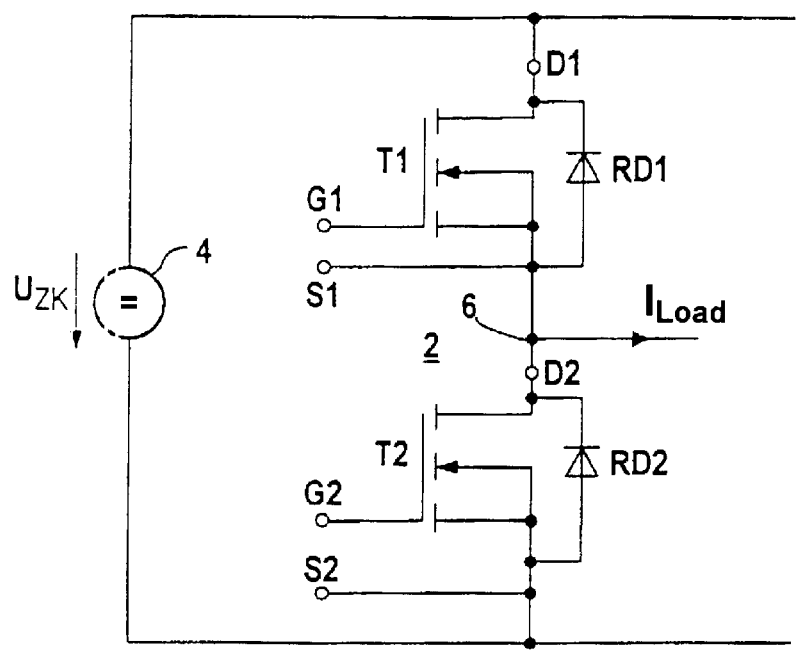
FIG. 1 illustrates a known invertor phase.
Figure 2:
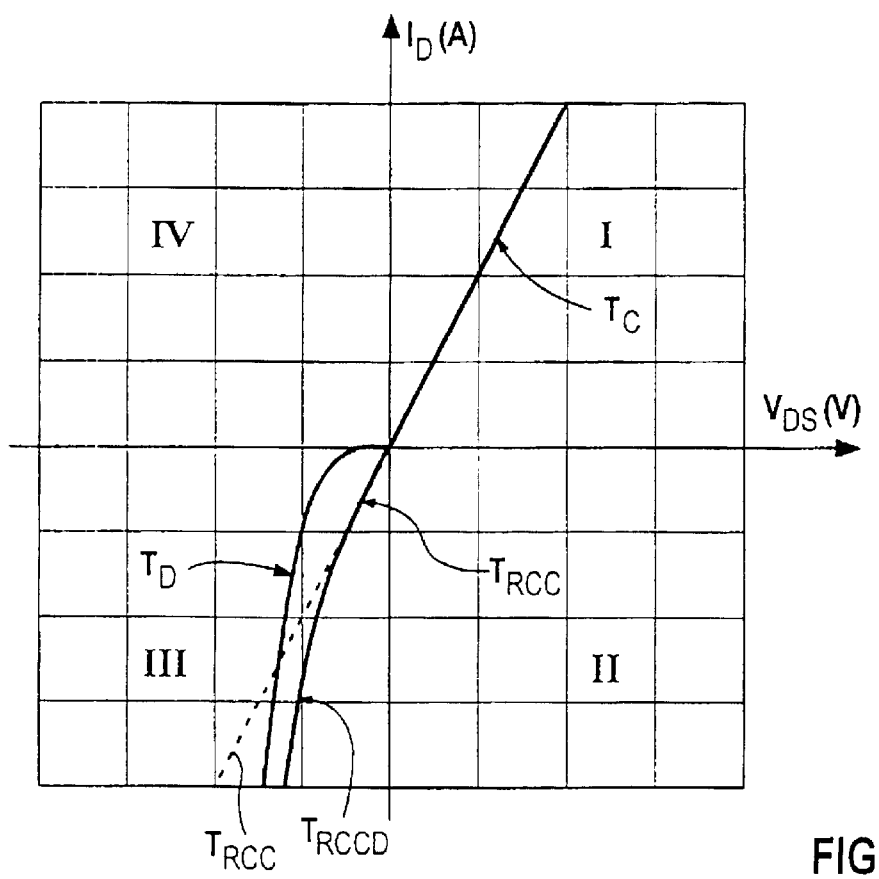
FIG. 2 illustrates a known current/voltage characteristic of the power converter valve T2 of FIG. 1.
Figure 3:
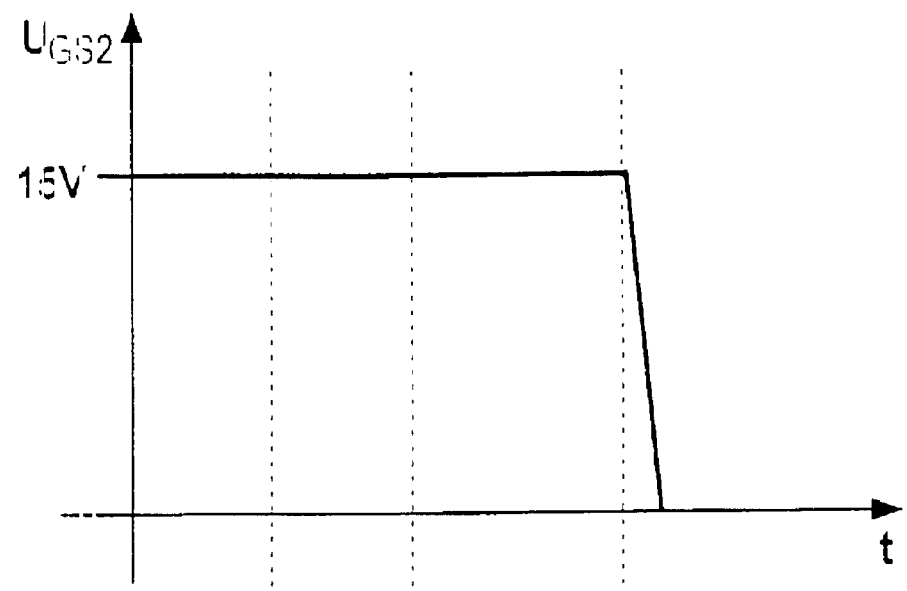
FIG. 3 illustrates, in a diagram plotted against time t, the profile of the gate-source voltage of the power converter valve T2 of FIG. 1 during the commutation process in accordance with the present invention.

The method of the present invention is disclosed herein below in detail with reference to the diagrams of FIGS. 3 and 4 in conjunction with the circuit arrangement according to FIG. 1 along with the other FIGURES. At the instant to, the power converter valve T1 is turned off and the power converter valve T2 is driven. Assuming that the load current $I_{LOAD} > 0$, the power converter valve T2 is free-running and carries the load current $I_{LOAD}$ counter to its main direction. The integral freewheeling diode RD2 participates in the carrying of current, in accordance with the diagram according to FIG. 2, as a function of the flowing drain current $I_D$. The power converter valve T1 is the power converter valve which is intended to accept the load current ILOAD during the commutation process. Therefore, this power converter valve T1 is designated as the current-accepting power converter valve. Si-MOSFETs which—as already mentioned in the introduction—are numbered among the unipolar power semiconductors which can carry current in both directions (drain-source, source-drain) are provided as the power converter valves T1 and T2. At the instant $T_1$, the current-accepting power converter valve T1 is driven, as a result of which it switches on. With this driving of the current-accepting power converter valve T1, the profile of the drain-source voltage $U_{DS2}$ is monitored with regard to a zero voltage crossing. This voltage zero crossing in the case of the drain voltage $U_{DS2}$ of the free-running power converter valve T2 occurs at the instant $t_2$. At this instant $t_2$, the free-running power converter valve T2 is switched off. This switch-off should be performed as rapidly as possible. Once the free-running power converter valve T2 is switched off, the entire intermediate circuit voltage $U_{ZK}$ is dropped across this power converter valve and the current-accepting power converter valve T1 carries the entire load current $I_{LOAD}$.

Figure 4:
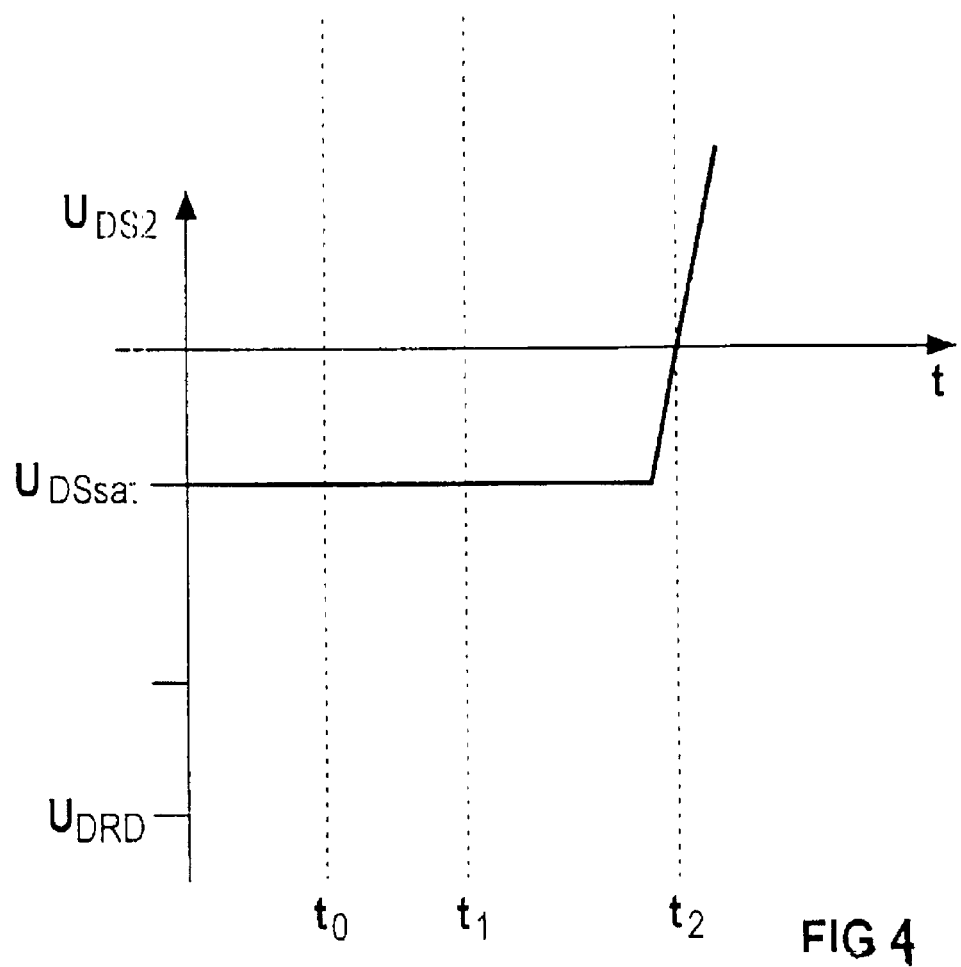
FIG. 4 illustrates, in a diagram plotted against time t, the profile of the associated drain voltage.

As can be seen from the diagram in accordance with FIG. 4, the magnitude of a saturation voltage $U_{DSsat}$ is dropped across the free-running, driven power converter valve T2. The value of this saturation voltage $U_{DSsat}$ is dependent on the drain current $I_D$ in the case of normally off MOSFETs. The smaller the drain current ID, the smaller the value of the saturation voltage $U_{DSsat}$. However, the smaller the value of this saturation voltage $U_{DSsat}$, the more difficult it is to identify the voltage zero crossing. If the voltage zero crossing is not identified until after the instant $t_2$, then a bridge short-circuit is present and both power converter valves T1 and T2 can possibly be switched off owing to overcurrent. If the voltage zero crossing is identified before the instant $t_2$, then the load current $I_{LOAD}$ flowing through the power converter valve T2 commutates completely to the integral freewheeling diode RD2, as a result of which switch-off losses are again caused on account of the stored charge of said freewheeling diode RD2.

The method according to the present invention represents an improvement in reducing the aforesaid losses, since irrespective of the drain current $I_D$ at the instant of the driving of the current-accepting power converter valve T1, the drain-source voltage $U_{DS}$ of the free-running power converter valve T2 assumes a predetermined value. The magnitude of this value, designated as reference value $U_{DSref}$, is greater than a saturation voltage $U_{DSsat}$, but less than the forward voltage $U_{DRD}$ of the integral freewheeling diode RD2.

Figure 5:
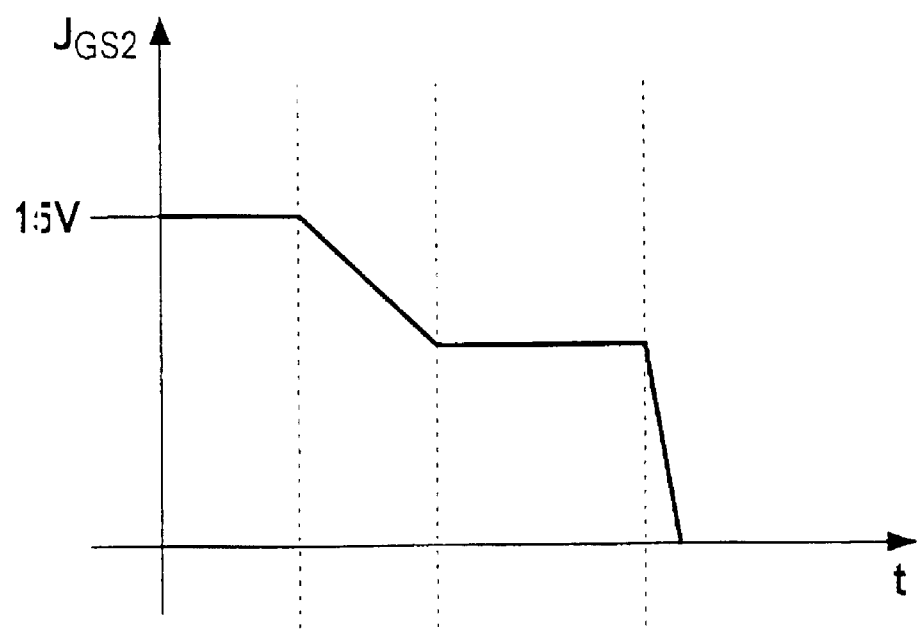
FIGS. 5 and 6 illustrate the profiles of the drain-source voltage and of the drain voltage in each case in a diagram plotted against time t in accordance with a preferred embodiment of the present invention.
Figure 6:
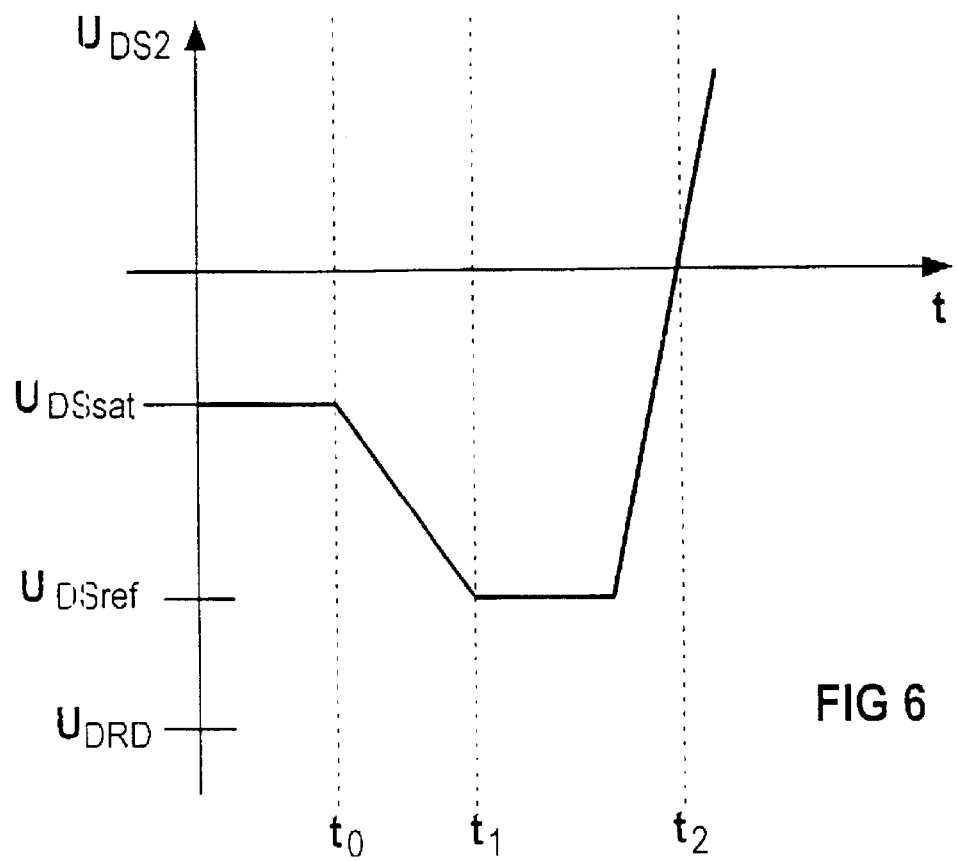

In order that, at the instant of the driving of the current-accepting power converter valve T1, the drain-source voltage $U_{DS}$ is equal to the reference voltage $U_{DSref}$, at the beginning of the commutation process, i.e. at the instant $t_0$ in accordance with FIG. 5, the gate-source voltage $U_{GS2}$ of the free-running power converter valve T2 is reduced until its drain-source voltage $U_{DS2}$ is equal to the reference voltage $U_{DSref}$. At the instant $t_1$ in FIG. 6, the magnitude of the drain-source voltage $U_{DS2}$ of the free-running power converter valve T2 has risen to the value of the reference voltage $U_{DSref}$. Since the value of the drain-source voltage $U_{DS2}$ of the free-running power converter valve T2 is equal to the predetermined value of the reference voltage $U_{DSref}$, the current-accepting power converter valve T1 is switched on. With the switching-on of the current-accepting power converter valve T1, the profile of the drain voltage $U_{DS2}$ is monitored with regard to a voltage zero crossing. As soon as the drain voltage $U_{DS2}$ has reached the value zero (instant $t_2$ in FIG. 6), the free-running power converter valve T2 is switched off as rapidly as possible. The reduction of the gate-source voltage $U_{GS2}$ of the free-running power converter valve T2 achieved by the novel method of the invention causes the drain-source voltage $U_{DS2}$ thereof to be brought to a predetermined value $U_{DSref}$. Consequently, the method according to the present invention becomes independent of the flowing drain current $I_D$.

If MOSFETs made of silicon are used as power converter valves T1 and T2, the threshold voltage $U_{DRD}$ of the integral freewheeling diode RD1 and RD2 is approximately 0.7 V. However, if MOSFETs made of silicon carbide are used, then the threshold voltage $U_{DRD}$ of the integral freewheeling diode RD1 and RD2 is approximately 2.8 V. This higher threshold voltage UDRD is manifested because silicon carbide has a much greater energy gap than silicon.

If the preferred embodiment of the method according to the present invention is used for reducing losses during the commutation process in an invertor phase 2 where power converter valves T1 and T2 MOSFETs made of silicon carbide are provided in each case, the method of the invention is simplified since the reference voltage $U_{DSref}$ can then be chosen from a larger voltage range. It must be ensured that the value of the reference voltage $U_{DSref}$ can never be equal to the threshold voltage $U_{DRD}$ of the integral freewheeling diode RD1, or RD2 of the power converter valve T1 or T2, respectively. If the magnitude of the drain-source voltage $U_{DS}$ exceeds the threshold voltage $U_{DRD}$ of the associated integral freewheeling diode RD, the latter is turned on, as a result of which this freewheeling diode RD again participates in the commutation process with the disadvantages mentioned in the background disclosure.

Figure 7:
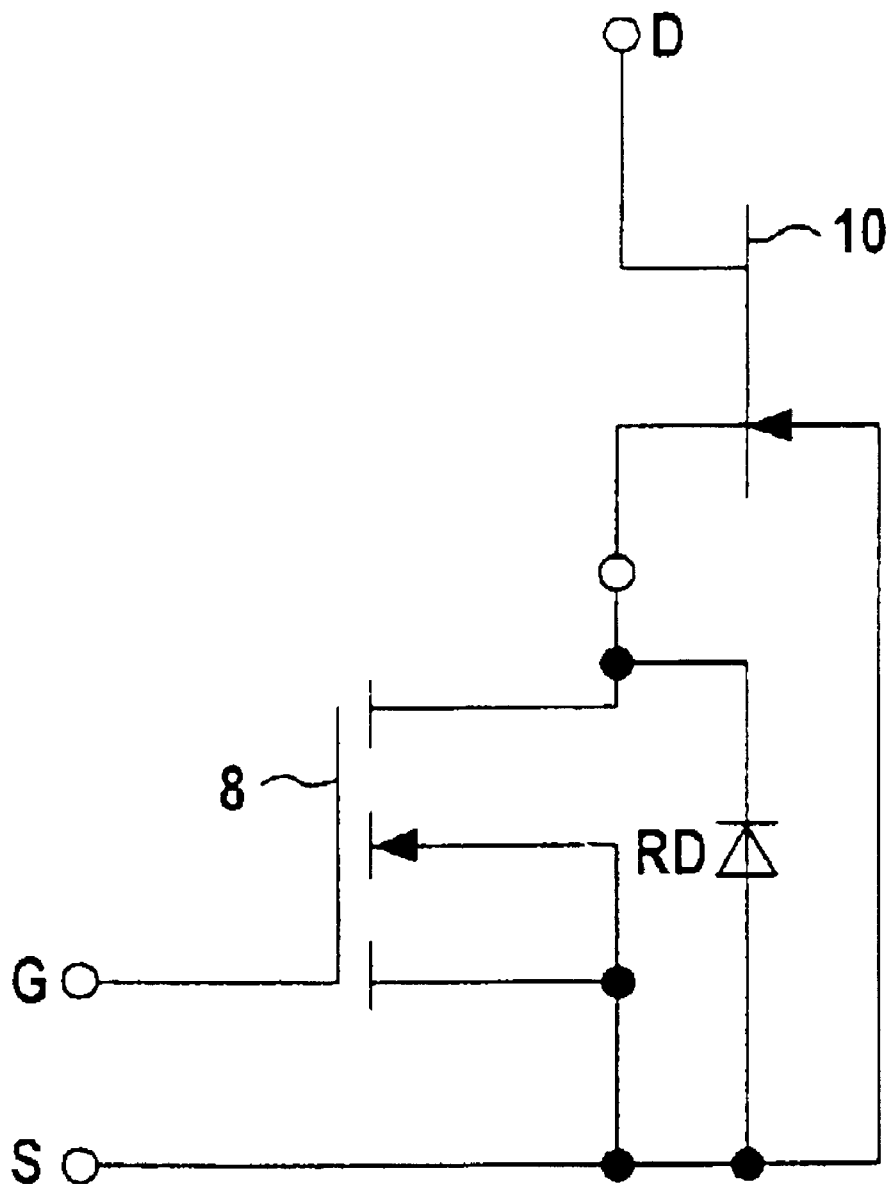
FIG. 7 illustrates the circuit of a known hybrid power MOSFET.

The circuit of a known hybrid power MOSFET is illustrated in more detail in FIG. 7. This hybrid power MOSFET is described in detail in DE 196 10 135 C1. This hybrid power MOSFET endures high reverse voltages, with the on-state losses being low, however. This hybrid power MOSFET has a normally off n-channel MOSFET 8 and a normally on n-channel junction FET. This junction FET 10 is also referred to as Junction Field-Effect Transistor (JFET).

The normally off n-channel MOSFET 8 is made of silicon, whereas the normally on n-channel JFET 10 is composed of silicon carbide. A commercially available low-voltage power MOSFET may be provided as Si-MOSFET 8. The Si-MOSFET has an integral freewheeling diode RD. The Si-MOSFET 8 and the SiC-JFET 10 are electrically connected in series, the gate of the SiC-JFET 10 being directly linked to the source terminal S of the Si-MOSFET 8.

The Si-MOSFET endures a reverse voltage of 30 V, for example. The SiC-JFET 10 connected in series with this is designed for a much higher reverse voltage. The integral freewheeling diode RD also has the low reverse voltage of the Si-MOSFET 8. A diode for a low reverse voltage has a very thin silicon wafer, which results in a very low stored charge. Owing to the virtually non-existent stored charge, the switch-off losses of this integral freewheeling diode RD of the Si-MOSFET 8 of the hybrid power MOSFET are minimal. For this reason, when using this known hybrid power MOSFET as power converter valve T1 and/or T2 of the invertor phase 2, precontrol of the method according to the invention is no longer necessary. Since the drain voltage $U_D$ of the Si-MOSFET 8 serves as control voltage for the SiC-JFET 10, the latter is automatically switched off as soon as a reverse voltage of 30 V, for example, is present across the Si-MOSFET 8 of the hybrid power MOSFET.

If a hybrid power MOSFET in accordance with German patent 196 10 135 is in each case used as power converter valve T1 and T2 of the invertor phase 2, the method described in the "PCI" publication in the introduction can be used, and, nevertheless, high losses do not occur during the commutation process. This is possible since the stored charge of the integral freewheeling diode RD of the MOSFET 8 of the hybrid power MOSFET is minimal. Participation of this freewheeling diode RD of the MOSFET 8 in the commutation process is non-critical.

We claim:

1. A method for reducing losses during the commutation of a free-running, driven power converter valve of an invertor phase to a current-accepting power converter valve of said invertor phase wherein the current-accepting power converter valve is switched on at the beginning of the commutation process, and wherein the free-running, driven power converter valve is switched off as soon as the value of its drain voltage ($U_D$) is zero.

2. The method according to claim 1, wherein, at the beginning of the commutation process, the free-running, driven power converter valve has a gate voltage which is decreased until its drain voltage is equal to a predetermined reference voltage.

* * * * *